United States Patent
Ensafdaran (10) Patent No.: US 10,635,130 B2
(45) Date of Patent: Apr. 28, 2020

(54) PROCESS, VOLTAGE AND TEMPERATURE TOLERANT CLOCK GENERATOR

(71) Applicant: Atlazo, Inc., La Jolla, CA (US)

(72) Inventor: Masoud Ensafdaran, San Diego, CA (US)

(73) Assignee: Atlazo, Inc., La Jolla, CA (US)

( * ) Notice: Subject to any disclaimer, the term of this patent is extended or adjusted under 35 U.S.C. 154(b) by 0 days.

(21) Appl. No.: 16/265,648

(22) Filed: Feb. 1, 2019

(65) Prior Publication Data

US 2019/0235566 A1    Aug. 1, 2019

Related U.S. Application Data (60) Provisional application No. 62/625,280, filed on Feb. 1, 2018.

(51) Int. Cl.
| | |
|---|---|
| *H03K 5/00* | (2006.01) |
| *G06F 1/08* | (2006.01) |
| *G06F 1/10* | (2006.01) |
| *H03K 5/1252* | (2006.01) |
| *G05F 3/16* | (2006.01) |

(52) U.S. Cl.
CPC ............... *G06F 1/08* (2013.01); *G06F 1/10* (2013.01); *H03K 5/00006* (2013.01); *H03K 5/1252* (2013.01); *G05F 3/16* (2013.01)

(58) Field of Classification Search
CPC ......... G06F 1/08; G06F 1/10; H03K 5/00006; H03K 5/1252; G05F 3/16
See application file for complete search history.

(56) References Cited

U.S. PATENT DOCUMENTS

| | | |
|---|---|---|
| 5,481,178 A | 1/1996 | Wilcox |
| 6,636,022 B2 | 10/2003 | Sluijs |
| (Continued) | | |

FOREIGN PATENT DOCUMENTS

JP    2014064436 A1    4/2014

OTHER PUBLICATIONS

Qian, J. et al. (Dec. 2009). Single-inductor Dual-output DC/DC Buck converter With High full-load Efficiency. 10.1109/EDSSC.2009.5394235. (3 pages).

(Continued)

*Primary Examiner* — Dinh T Le
(74) *Attorney, Agent, or Firm* — Perkins Coie LLP (57) ABSTRACT

Devices, methods, and systems are described that generate process, voltage and temperature tolerant clock generators, which can be used in low power and low cost applications. The clock generators eliminate the need for a crystal oscillator, are simple to implement, and can use a single frequency calibration step to initially tune the frequency to a reference frequency value, and to allow the clock generator to operate in the presence of process, voltage or temperature variations. One example clock circuit includes a voltage-controlled oscillator that provides a clock output, a gain circuit to receive a reference voltage as one input and a changeable voltage on another input. The clock circuit also includes a frequency-to-voltage convertor circuit that receives a reference current and produces the changeable voltage provided to gain circuit, while a ratio of the reference voltage to the reference current is constant.

27 Claims, 6 Drawing Sheets

(56) References Cited

U.S. PATENT DOCUMENTS

| | | | |
|---|---|---|---|
| 7,174,523 B2 | 2/2007 | Engel et al. | |
| 7,298,119 B1 | 11/2007 | Amram Summit et al. | |
| 7,487,474 B2 | 2/2009 | Ciplickas | |
| 7,552,409 B2 | 6/2009 | Kucukcakar | |
| 7,913,071 B2 | 3/2011 | Mallik et al. | |
| 8,018,212 B1 | 9/2011 | Petricek | |
| 8,049,568 B2* | 11/2011 | Youssef | H03L 7/099 327/156 |
| 8,051,398 B2 | 11/2011 | Bittlestone | |
| 8,129,961 B2 | 3/2012 | Buethker | |
| 8,169,203 B1 | 5/2012 | Vemula | |
| 8,307,317 B2 | 11/2012 | Adams | |
| 8,464,199 B1 | 6/2013 | Charlebois et al. | |
| 8,543,966 B2 | 9/2013 | Bickford | |
| 8,692,584 B2* | 4/2014 | Nakamura | H03L 7/00 327/101 |
| 9,281,780 B2* | 3/2016 | Yayama | H01O 13/02 |
| 9,317,048 B2 | 4/2016 | Kuang | |
| 9,408,266 B2 | 8/2016 | Logiudice | |
| 9,503,106 B1* | 11/2016 | Ding | H03L 7/06 |
| 9,698,674 B1 | 7/2017 | Cherkassky et al. | |
| 9,829,911 B2* | 11/2017 | Yayama | H01O 13/02 |
| 9,915,963 B1 | 3/2018 | Wu | |
| 10,222,852 B2 | 3/2019 | Foreman | |
| 10,236,763 B2 | 3/2019 | Hu | |
| 10,416,746 B2 | 9/2019 | Solki et al. | |
| 2005/0184711 A1 | 8/2005 | Chen et al. | |
| 2006/0114017 A1 | 6/2006 | El-kik | |
| 2007/0018712 A1 | 1/2007 | GK. | |
| 2007/0089078 A1 | 4/2007 | Engel | |
| 2008/0122291 A1 | 5/2008 | Uchimoto | |
| 2009/0037854 A1 | 2/2009 | Bittlestone | |
| 2009/0284240 A1 | 11/2009 | Zhang | |
| 2010/0052635 A1 | 3/2010 | Wang | |
| 2010/0194434 A1 | 8/2010 | Tran Vo | |
| 2010/0327952 A1 | 12/2010 | Wu | |
| 2011/0248764 A1 | 10/2011 | Das | |
| 2011/0267017 A1 | 11/2011 | Zhang et al. | |
| 2012/0124538 A1 | 5/2012 | Lackey | |
| 2012/0159216 A1 | 6/2012 | Wells | |
| 2013/0069608 A1 | 3/2013 | Gakhar et al. | |
| 2013/0099764 A1 | 4/2013 | Zhang et al. | |
| 2013/0271100 A1 | 10/2013 | El-Nozahi | |
| 2014/0152344 A1 | 6/2014 | Chiou | |
| 2014/0225579 A1 | 8/2014 | Dally | |
| 2014/0232360 A1 | 8/2014 | Dally | |
| 2015/0198960 A1 | 7/2015 | Zhang et al. | |
| 2015/0214841 A1 | 7/2015 | Ramorini et al. | |
| 2016/0077537 A1 | 3/2016 | Enjalbert et al. | |
| 2016/0094125 A1 | 3/2016 | Milanesi et al. | |
| 2016/0118894 A1 | 4/2016 | Zhang | |
| 2016/0164497 A1 | 6/2016 | Agarwal | |
| 2016/0334818 A1 | 11/2016 | Singh | |
| 2016/0359421 A1 | 12/2016 | Lin | |
| 2017/0033698 A1 | 2/2017 | Vemuri | |
| 2017/0093350 A1 | 3/2017 | Ramos et al. | |
| 2017/0115678 A1 | 4/2017 | Qing et al. | |
| 2017/0160757 A1 | 6/2017 | Yang | |
| 2017/0272073 A1 | 9/2017 | Betz | |
| 2018/0120879 A1 | 5/2018 | Du et al. | |
| 2018/0173258 A1 | 6/2018 | Singh | |
| 2018/0284829 A1 | 10/2018 | Hussien et al. | |
| 2018/0321092 A1 | 11/2018 | Jones | |
| 2019/0131876 A1 | 5/2019 | Luff | |
| 2019/0212799 A1 | 7/2019 | Solki et al. | |
| 2019/0213292 A1 | 7/2019 | Solki et al. | |
| 2019/0214906 A1 | 7/2019 | Mahmoudi | |
| 2019/0258283 A1 | 8/2019 | Pishdad et al. | |
| 2019/0280593 A1 | 9/2019 | Hedayati et al. | |

OTHER PUBLICATIONS

Tao, C. et al. (Nov. 2011). A Buck Converter With Reduced Output Spurs Using Asynchronous Frequency Hopping. IEEE Transactions on Circuits and Systems—II: Express Briefs, vol. 58, No. 11, p. 709-713. (5 pages).

Ko, Y. et al. (Jun. 2014) Load-Balance-Independent High Efficiency Single-Inductor Multiple-Output (SIMO) DC-DC Converters. Journal of Semiconductor Technology and Science, vol. 14, No. 3., p. 300-312. (13 pages).

Harris, David M. Det al., "A transregional model for near-threshold circuits with application to minimum-energy operation," in Proc. 2010 Int. Conf. Microelectronics (ICM), Cairo, Egypt, Dec. 19-22, 2010, pp. 64-67.

S. Kosonocky et al., "Designing in Scaled Technologies: 32nm and Beyond," presented at 2012 Symposia on VLSI Technology and Circuits, Honolulu, HI, Jun. 2012.

Jungseob Lee et al., "Improving Throughput of Power-Constrained GPUs Using Dynamic Voltage/Frequency and Core Scaling," in Proc. 2011 Int. Conf. Parallel Architectures and Compilation Techniques (PACT), Galveston, TX, Oct. 10-14, 2011, pp. 111-120.

Massimo Alioto, "Ultra-Low Power VLSI Circuit Design Demystified and Explained: A Tutorial," IEEE Trans. Circuits Syst. I, Reg. Papers, vol. 59, pp. 3-29, Jan. 2012.

Alice Wang, et al., "Optimal supply and threshold scaling for subthreshold CMOS circuits," in Proc. 2002 IEEE computer Society Annu. Symp. VLSI, Pittsburg, PA, Apr. 25-26, 2002, pp. 5-9.

Bo Zhai et al., "Energy-Efficient Subthreshold Processor Design," IEEE Trans. Very Large Scale Integr. (VLSI) Syst., vol. 17, pp. 1127-1137, Aug. 2009.

Y. Pu et al., "Misleading energy and performance claims in sub/near threshold digital systems," in Proc. 2010 IEEE/ACM Int. Conf. Computer-Aided Design (ICCAD), San Jose, CA, Nov. 7-11, 2010, pp. 625-631.

D. Bol et al., "Interests and Limitations of Technology Scaling for Subthreshold Logic," IEEE Trans. Very Large Scale Integr. (VLSI) Syst., vol. 17, pp. 1508-1519, Oct. 2009.

S. Jain et al., "A 280mV-to-1.2V wide-operating-range IA-32 processor in 32nm CMOS," in Digest of Technical Papers 2012 IEEE Int. Solid-State Circuits Conf. (ISSCC), San Francisco, CA, Feb. 19-23, 2012, pp. 66-68.

D. Wolpert and P. Ampadu, "Exploiting Programmable Temperature Compensation Devices to Manage Temperature-Induced Delay Uncertainty," IEEE Trans. Circuits and Syst. I: Reg. Papers, vol. 59, pp. 735-748, Apr. 2012.

BSIM4.3.0 MOSFET Model—User's Manual, Department of Electrical Engineering and Computer Sciences, University of California, Berkeley, CA, 2003.

M. Faisal, N. E. Roberts and D. D. Wentzloff, "A 300nW near-threshold 187.5-500 kHz programmable clock generator for ultra low power SoCs," 2015 IEEE SOI-3D-Subthreshold Microelectronics Technology Unified Conference (S3S), Rohnert Park, CA, 2015, pp. 1-3.

M. Huang and C. Hung, "Full-custom all-digital phase locked loop for clock generation," VLSI Design, Automation and Test(VLSI-DAT), Hsinchu, 2015, pp. 1-4.

J. Liu et al., "A 0.8V, sub-mW, varactor-tuning ring-oscillator-based clock generator in 32nm CMOS," IEEE Asian Solid-State Circuits Conference 2011, Jeju, 2011, pp. 337-340.

A. Tajalli and Y. Leblebici, "A 9 pW/Hz adjustable clock generator with 3-decade tuning range for dynamic power management in subthreshold SCL systems," 2010 Proceedings of ESSCIRC, Seville, 2010, pp. 242-245.

X. Zhang and A. B. Apsel, "A Low-Power, Process-and -Temperature-Compensated Ring Oscillator With Addition-Based Current Source," in IEEE Transactions on Circuits and Systems I: Regular Papers, vol. 58, No. 5, pp. 868-878, May 2011.

Man et al, "A High Slew-Rate Push-Pull Output Amplifier for Low-Quiescent Current Low-Dropout Regulators With Transient-Response Improvement", IEEE Transactions on Circuits and Systems II: Express Briefs, 2007.

Y. Lu, et al., "A 0.65ns-Response-Time 3.01ps FOM Fully-Integrated Low-Dropout Regulator with Full-Spectrum Power-Supply-Rejection for Wideband Communication Systems", IEEE ISSCC, pp. 306-307, Feb. 2014.

(56) References Cited

OTHER PUBLICATIONS

Chen, Y. et. al, "An Ultra-low Quiescent Current Output Capacitor-less Low-Dropout Regulator with a Novel Slew-rate-enhanced Circuit", 2014 IEEE International Symposium on Radio-Frequency Integration Technology.
X. Ming, et al, "A Low-Power Ultra-Fast Capacitor-Less LDO With Advanced Dynamic Push-Pull Techniques", International Conference on VLSI and System-on-Chip, pp. 54-59, 2011.
Liu et al, "An Ultra-Low Power Voltage Regulator for RFID Application", Chia-Chin, Chunhong Chen, 2013 IEEE 56th International Midwest Symposium on Circuits and Systems (MWSCAS).
Liu et al, "A 90nA quiescent current 1.5V-5V 50mA asynchronous folding LDO using dual loop control", 2016 IEEE Asian Solid-State Circuits Conference (A-SSCC).
Mazumdar et al, "A Digitally-Controlled Power-Aware Low-Dropout Regulator to Reduce Standby Current Drain in Ultra-Low-Power MCU", 2015 International Symposium on Quality Electronic Design.
Liang et al, "A 802 nA Quiescent Current and 100 mA Load Low-Dropout Regulator for Micro Energy Harvest System", 2018 2018 13th IEEE Conference on Industrial Electronics and Applications (ICIEA).
Rikan et. al, "A low leakage retention LDO and leakage-based BGR with 120nA quiescent current", 2017 International SoC Design Conference (ISOCC).
Chien-Yi Wu et al, "An ultra-low power capacitor-less LDO for always-on domain in NB-IoT applications", 2018 IEEE International Conference on Applied System Invention (ICASI).
Wang, Chao et al., "DLAU: A Scalable Deep Learning Accelerator Unit on FPGA", IEEE Transactions on Computer-Aided Design of Integrated Circuits and Systems (vol. 36, Issue: 3, Mar. 2017).
Courbariaux, Matthieu et al., "Binarized Neural Networks: Training Deep Neural Networks with Weights and Activations Constrained to +1 or −1", arXiv:1602.02830v3, Mar. 17, 2016; pp. 1-11.
Rastegari, Mohammad et al., "XNOR-Net: ImageNet Classification Using Binary Convolutional Neural Networks", European Conference on Computer Vision ECCV Aug. 2, 2016: Computer Vision—ECCV, pp. 525-542.
International Application No. PCT/US/2019/012414 International Search Report and Written Opinion dated May 8, 2019.
Solki, Shahin et al. U.S. Appl. No. 16/242,405 Non-Final Office Action dated Mar. 29, 2019.
Solki, Shahin et al. U.S. Appl. No. 16/244,509 Non-Final Office Action dated Mar. 28, 2019.
Solki, Shahin et al. U.S. Appl. No. 16/244,509 Notice of Allowance dated Jul. 17, 2019.
Hedayati, Hajir et al. U.S. Appl. No. 16/295,876 Non-Final Office Action dated Sep. 12, 2019.
Pishdad, Bardia et al. U.S. Appl. No. 16/281,021 Non-Final Office Action dated Jul. 10, 2019.
Solki, Shahin et al. U.S. Appl. No. 16/242,405 Non-final Office Action dated Sep. 25, 2019.
Mahmoudi, Farsheed, et al. U.S. Appl. No. 16/240,557 Non-Final Office Action dated Aug. 2, 2019.
Pishdad, Bardia et al. U.S. Appl. No. 16/281,021 Notice of Allowance dated Oct. 17, 2019.
Solki, Shahin et al., U.S. Appl. No. 16/242,405 Notice of Allowance dated Nov. 27, 2019.

\* cited by examiner

Provide a reference voltage level to a first input of a gain circuit, where an output of the gain circuit controls a voltage-controlled oscillator generating an output clock that operates at an output clock frequency
602

Contoal a charging and a discharging of a switching capacitor that is positioned in a feedback loop between the output of the voltage-controlled oscillator and a second input of the gain circuit
604

Supply the switching capacitor with a reference current to allow the switching capacitor to alternatively charge and discharge as controlled by the output clock, where a ratio of the reference voltage to the reference current is constant and a voltage level across the switching capacitor that is supplied to the second input of the gain circuit is, on average, equal to the reference voltage level
606

FIG. 6

PROCESS, VOLTAGE AND TEMPERATURE TOLERANT CLOCK GENERATOR

RELATED APPLICATIONS

This application claims priority to the provisional application with Ser. No. 62/625,280, titled "Process, Voltage and Temperature Tolerant Clock Generator," filed Feb. 1, 2018. The entire contents of the above noted provisional application are incorporated by reference as part of the disclosure of this document.

TECHNICAL FIELD

The present disclosure relates to timing circuits, and more specifically clock generation circuits.

BACKGROUND

The Internet of things (IoT) is the network of physical devices that can include appliances, vehicles and other devices that have embedded electronics, software, and network connectivity to enable these physical devices to connect and exchange data. Each physical device of the IoT can be uniquely identifiable through its embedded computing system and able to communicate with other devices using the existing infrastructure of the Internet. While not limited to IOT, the small form factor, ultra-low power consumption, and low cost requirements make power consumption and physical footprint of the associated circuitry critically important in IoT and many other applications since they directly impact the battery lifetime, cost and efficiency of such systems.

DETAILED DESCRIPTION

In the following description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

Clock generation is an essential part of many digital or mixed signal systems including, but not limited to, IoT applications. In cases, where an accurate, low jitter clock is needed, crystal oscillators are typically used. However crystal oscillators are power hungry and expensive. Ring oscillators provide an alternative to crystal oscillators and can offer lower power consumption and low cost, but suffer from large frequency variations due to process and temperature variations. In applications where power consumption and cost are key factors, such as in the IOT and biomedical systems, it is desirable to have a low power and low cost clock generator, which also produces an output with little or no frequency variations.

The disclosed embodiments describe methods, systems and devices that include low cost clock generators having an output with little or no frequency variations that are tolerant to changes in process, voltage and temperature (PVT), as well as other variations. Such variations can be the result of, for example, environmental conditions, imperfect power supplies or circuit fabrication technologies. For instance, integrated circuits must work under different environmental conditions, such as −40 degrees Celsius to +125 degrees Celsius for some products. Such variations in temperature in turn affect the operations of the electronic circuits and cause variations in the clock output that is implemented on a chip. In a similar vein, voltages that are supplied to the electronic circuits may not be perfectly regulated, and thus can cause variations in the operations of the electronic circuits, including variations in the clock output frequency. The process by which the integrated circuits are manufactured also introduces variations across a particular wafer, or from one wafer to another wafer, thus introducing additional variations that must be accounted for, or compensated, in most practical systems. The effects of PVT variations are exacerbated in low power applications, such as in IoT systems, where such variations can cause the system to operate in a non-optimal mode, leading to additional power consumption.

Another consideration is that in a system-on-chip (SOC) implementation, it is desirable to control the clock frequency in order to save power when the application speed is low. Conventionally, phased locked loops (PLLs) are used to generate a clock in multiples of a reference frequency. However, PLLs need a reference clock. To save power and cost, in some applications it is desirable to avoid a reference clock oscillator. Furthermore, in sleep mode and when the device is always on, the SOC may need to reduce the clock frequency to a very low value to save power.

These and other desired features and benefits are achieved by the disclosed technology that provides process, voltage and temperature tolerant clock generators, which use a frequency-to-voltage locking loop, and are further capable of generating a selectable output clock frequency. The disclosed clock generators further eliminate the need for a crystal, which is a relatively bulky off-chip component.

Figure 1:
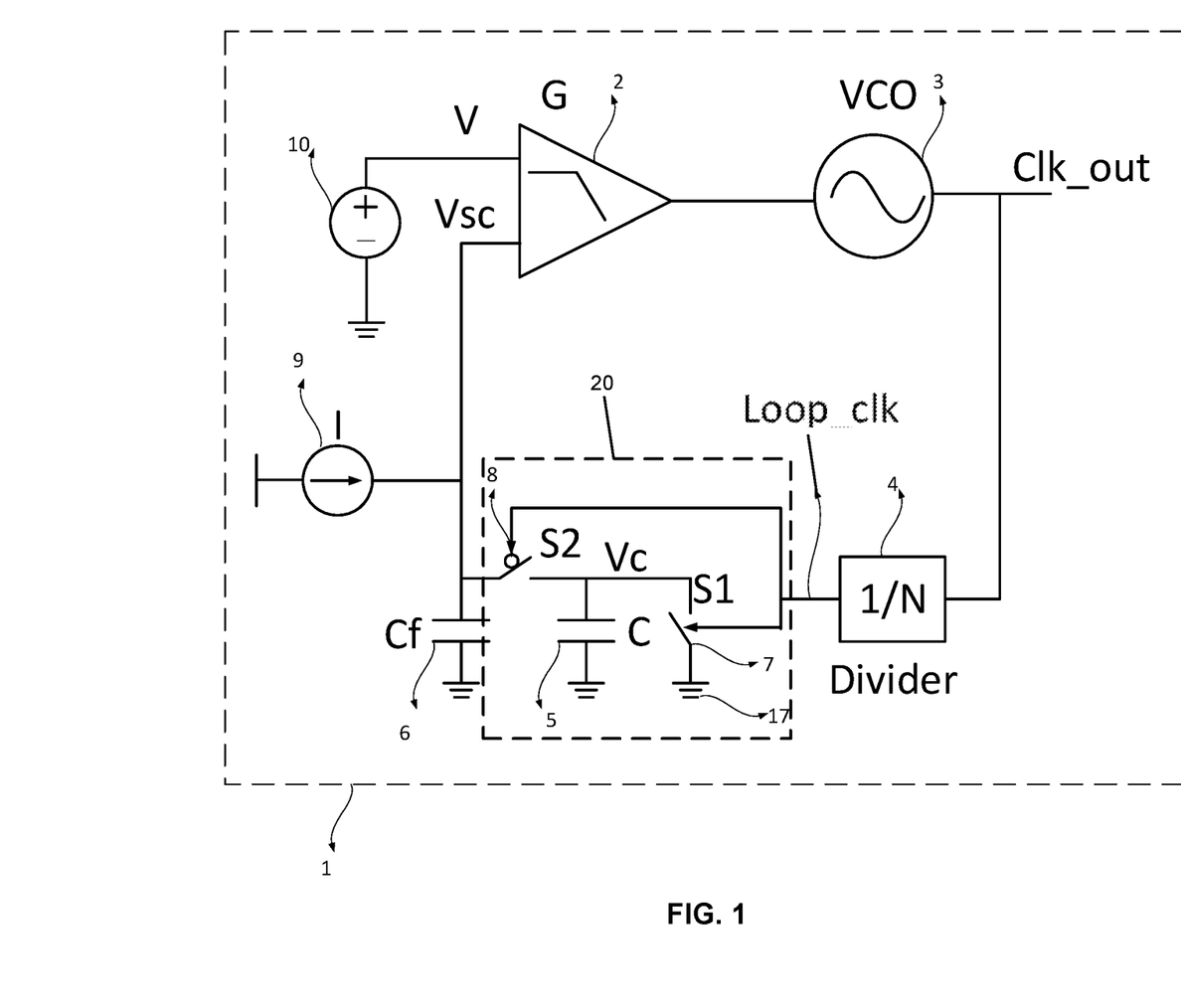
FIG. 1 illustrates a clock generator circuit in accordance with some exemplary embodiments.

FIG. 1 illustrates a clock generator in accordance with an exemplary embodiment. The clock generator 1 includes a reference voltage 10 supply, a gain amplifier (or gain block) 2 (for example, a differential amplifier that amplifies the difference in its input signals), a voltage-controlled oscillator 3, the output of which is the clock output (Clk_out). The clock generator 1 also includes a reference current 9 supply, a filtering capacitor $C_f$ (6), a 1/N frequency divider (4), where N can be an integer or a non-integer value, and a switched capacitor resistor 20, which includes two switches S1 (7) and S2 (8) and a switching capacitor 5 which is connected between the common ends of S1/S2 and ground 17. The switches S1 and S2 are controlled by Loop_clk, where S1 is on when Loop_clk is high, and S2 is on when Loop_clk is low.

The exemplary clock generator of FIG. 1 locks the output frequency to a constant ratio of a voltage reference (V) and a current reference (I). The circuit converts the output clock frequency information to a voltage using the switched capacitor resistor 20 and compares the voltage Vsc across the switched capacitor resistor 20 to a reference voltage, V. Such a circuit uses a reference current, I, that supplies current to the switched capacitor resistor 20 to convert the output clock frequency information to voltage Vcs and to lock this frequency dependent voltage, Vcs, to the reference voltage, V, using a feedback loop.

In some embodiments, in order to reduce or eliminate clock output frequency variations, the ratio of the reference current to reference voltage (I/V) is held to be constant (e.g., over a specific temperature range). For example, in some implementations, the ratio is held constant to within 0.5% over the temperature change of −40 to +125 degrees Celsius. The following analysis of the disclosed circuitry is provided to facilitate the understanding of the underlying concepts.

Referring back to FIG. 1, it can be seen that the output clock frequency follows the following relationship:

$$f_{clk\_out} = N \times f_{loop\_clk} \quad (1).$$

Further, the average voltage across the switched capacitor resistor is given by:

$$V_{SC} = \frac{1}{C \times f_{loop\_clk}} = \frac{I \times N}{C \times f_{clk\_out}}. \quad (2)$$

The feedback loop equalizes Vsc to V, so we have:

$$V = \frac{I \times N}{C \times f_{clk\_out}}. \quad (3)$$

Rearranging Equation (3), we can obtain:

$$f_{clk\_out} = \frac{I \times N}{C \times V}. \quad (4)$$

Equation (4) shows that $f_{clk\_out}$ can be held constant when the values of N, C and I/V are held constant.

The above analysis has been simplified to facilitate the understanding of the underlying concepts, and based on the assumption that the loop gain is very large. If a gain, A, is assumed for the amplifier and the oscillator, the following relationship is obtained:

$$V = \frac{I \times N}{C \times f_{clk\_out}} + \frac{f_{clk\_out}}{A}. \quad (5)$$

It should be noted that the valued of V in Equation (5) approaches that in Equation (3) when A is sufficiently large.

It is thus evident that when N, C and $$\frac{1}{V}$$

are held constant, any changes in $f_{clk\_out}$ (e.g., due to PVT variations) are automatically corrected by the feedback loop, which ensures that Vsc remains, on average, equal to V, thus providing a corrected voltage value to VCO. Vsc can include ripples due to the switching nature of the switching capacitor resistor; the frequency of the ripple depends on the factor, $f_{loop\_clk}$, and can be controlled or mitigated by selecting the proper value for the filtering capacitor, $C_f$.

With reference to the exemplary clock generator of FIG. 1, some of the components and operations of the clock generation system can be summarized below.

The clock generator 1 uses a voltage-controlled oscillator 3 to generate the output clock. The clock generator 1 also uses a clock divider 4 to divide the output clock frequency by a factor of N and generate the Loop_clk. In some embodiments, the divider 4 is a reprogrammable divider that allows the generation of the output clock frequency as multiples of the Loop_clk. It should be noted that while the clock divider enables the generation of a scalable clock frequency, in some implementations, the divider 4 can be eliminated (or N can be set to 1). The switched capacitor resistor 20 includes the capacitor C (5), switch S1 (7) and switch S2 (8). S1 (7) discharges the capacitor C (5) voltage Vc into ground 17 in the high state of the Loop_clk (i.e., when S1 is closed). When S2 (8) is closed (and S1 (7) is opened) in the low state of the loop_clk, the charge of the capacitor C (5) is shared between Vc node and Vsc node. The clock generator 1 uses the reference current, I (9), and the switched capacitor resistor 20 to convert the loop_clk frequency to a voltage, Vsc. A filtering capacitor, $C_f$ (6), is connected between the node Vsc and ground to filter out the switching noise of the switch capacitor resistor circuit 20. The gain block G (2) compares Vsc to the reference voltage V (10) and the gain block G (2) output voltage is used to control the output frequency of the VCO (3).

Figure 2:
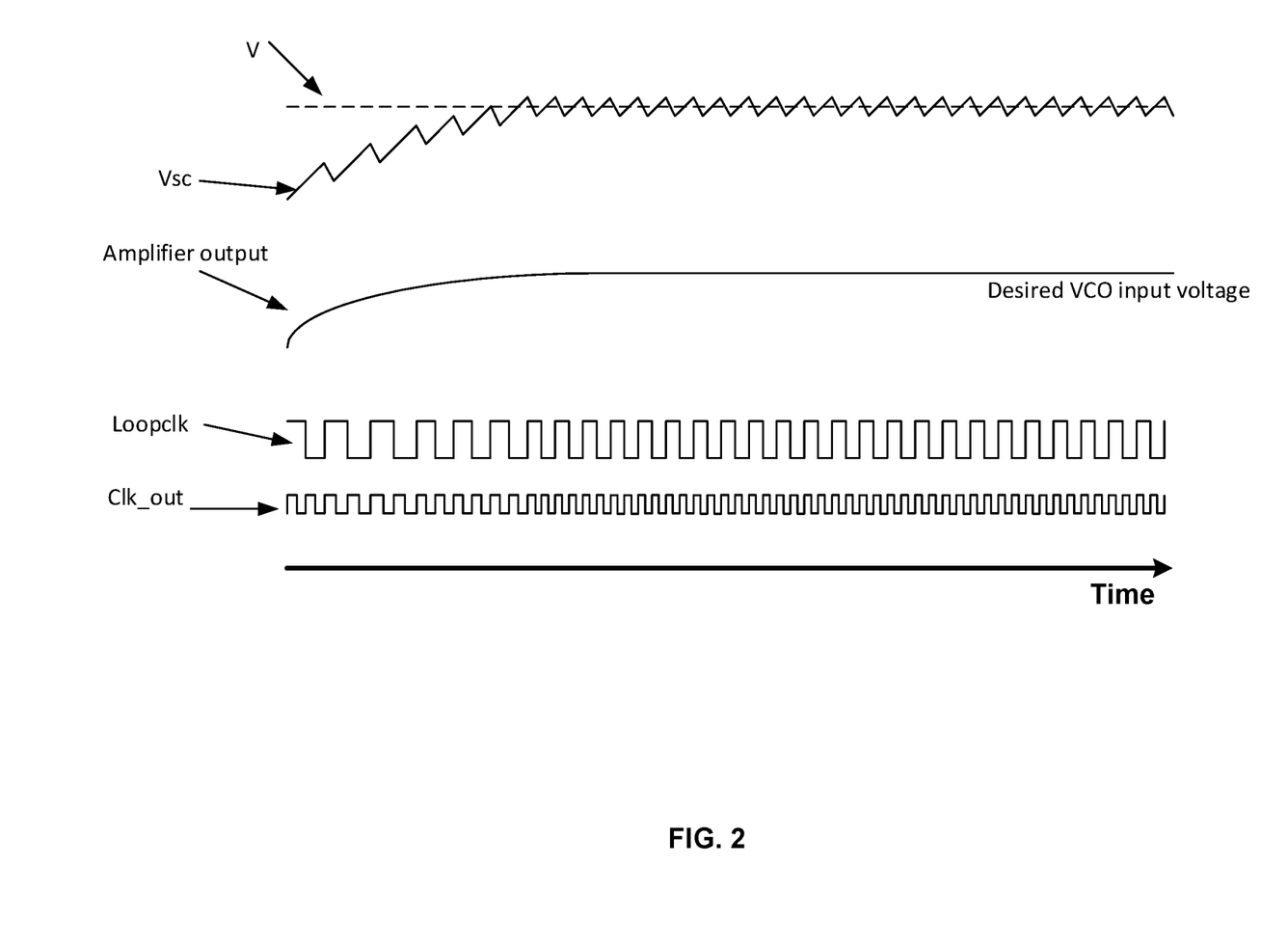
FIG. 2 illustrates simplified plots of voltages and clocks for a clock generator in accordance with some exemplary embodiments.

To provide an example of the operations of the exemplary clock generator, FIG. 2 illustrates simplified plots of voltages and clocks when N=2 (i.e., Clk_out frequency is twice the Loop_clk). As shown in the illustration of FIG. 2, after an initial settling period, the value of Vsc settles to V value. The ripple of Vsc can be controlled based on the value of $C_f$. The value of the ripple on Vsc depends on the C/Cf ratio. To reduce the ripple for a constant C, the value of Cf can be increased.

As noted earlier, in order to eliminate or reduce output clock frequency variations, the ratio of (I/V) (or equivalently V/I) must be kept constant. In some exemplary embodiments, the reference voltage (10) and reference current (9) are supplied as bandgap voltage and current reference voltage and current, which can be supplied, for example, from another part of the SoC to the clock generator.

By the way of example and not by limitation, the following values can be used to construct one exemplary clock generator having a particular output clock frequency. I=50 nA; C=100 fF; V=0.5 V; N=16. Based on Equation (3), the output clock frequency can be determined:

$$f_{clk\_out} = \frac{50 \times 10^{-9} \times 16}{100 \times 10^{-15} \times 0.5} = 16 \times 10^6.$$

Based on Equation (3), loop_clock frequency can be determined:

$$f_{loop_{clock}} = \frac{16 \times 10^6}{16} = 10^6$$

It is evident that other values can be selected to obtain the desired performance and frequency values.

Figure 3:
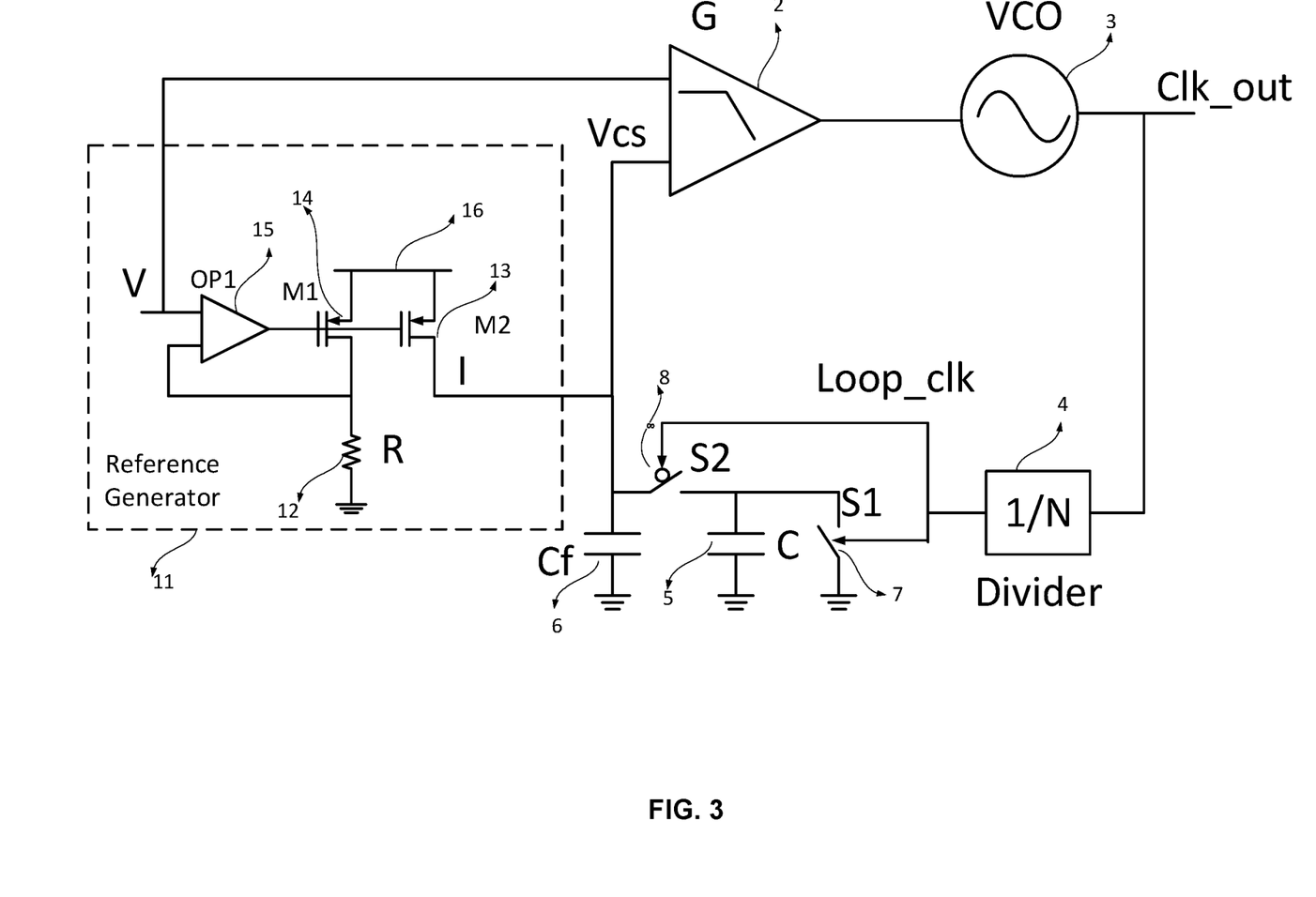
FIG. 3 illustrates a clock generator including a reference current generator circuit in accordance with some exemplary embodiments.

In some exemplary embodiments, the reference voltage and current can be generated using additional circuitry that can be part of the clock generator system. FIG. 3 illustrates an exemplary embodiment in which a reference generator 11 is used to generate the reference current, I, from the reference voltage, V. The reference generator 11 uses an operational amplifier 15, a PMOS transistor M1 (14) and a resistor R (12) to generate I from R in M1 (14) transistor. In some implementations, the resistor R (12) is invariable to temperature change (e.g., is a zero-temperature coefficient resistor). The reference generator 11 has a conversion factor of V/I=R. A current mirror comprising M1 (14) and M2 (13) is used to copy the M1 current to M2 and apply it to the Vsc node.

Figure 4:
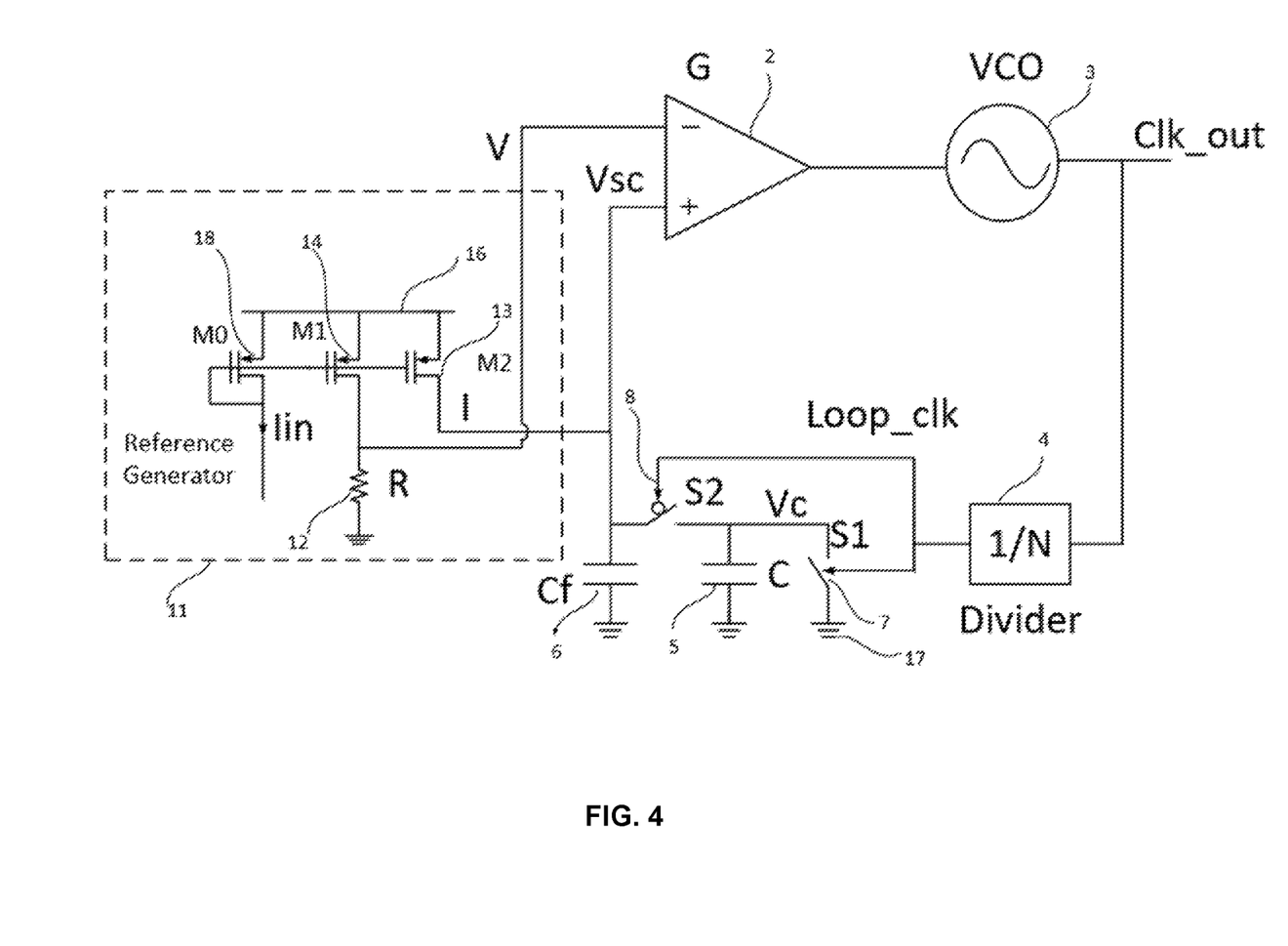
FIG. 4 illustrates a clock generator including another reference current generator circuit in accordance with some exemplary embodiments.

FIG. 4 illustrates a clock generator including another exemplary reference current generator circuit 11. In this embodiment, two equal reference currents can be used. The reference generator 11 uses an input current $I_{in}$ to generate two equal reference currents using PMOS transistors M0 (18), M1 (14) and M2 (16). One of the reference currents drives a resistor R (12) to generate the voltage, V. The second reference current I, drives the switched capacitor circuit C (5) at the Vsc node. In this exemplary implementation, the currents must be matched but they don't need to be constant over voltage, temperature and process.

One of the features of the disclosed clock generators is ability to use one single calibration point to tune the output frequency to a reference clock frequency. For example, an initial calibration for the clock generator can include performing the one-time operation of using a reference clock frequency (e.g., in a laboratory or factory setting), and tuning the switching capacitor C value to ensure that the desired output clock frequency is obtained. After the calibration, the constant output frequency is guaranteed over process, voltage and temperature variations over a desired range. In some implementations, the switching capacitor, C, can comprise a plurality of capacitors and during the fine-tuning calibration process, one or more of the plurality of capacitors can be connected together to achieve the desired output clock frequency.

In another implementation, the frequency tuning can be implemented by changing the V/I ratio. For example, the value of R (12) in the reference generator of FIG. 4 can be tuned to obtain the desired output frequency.

Figure 5:
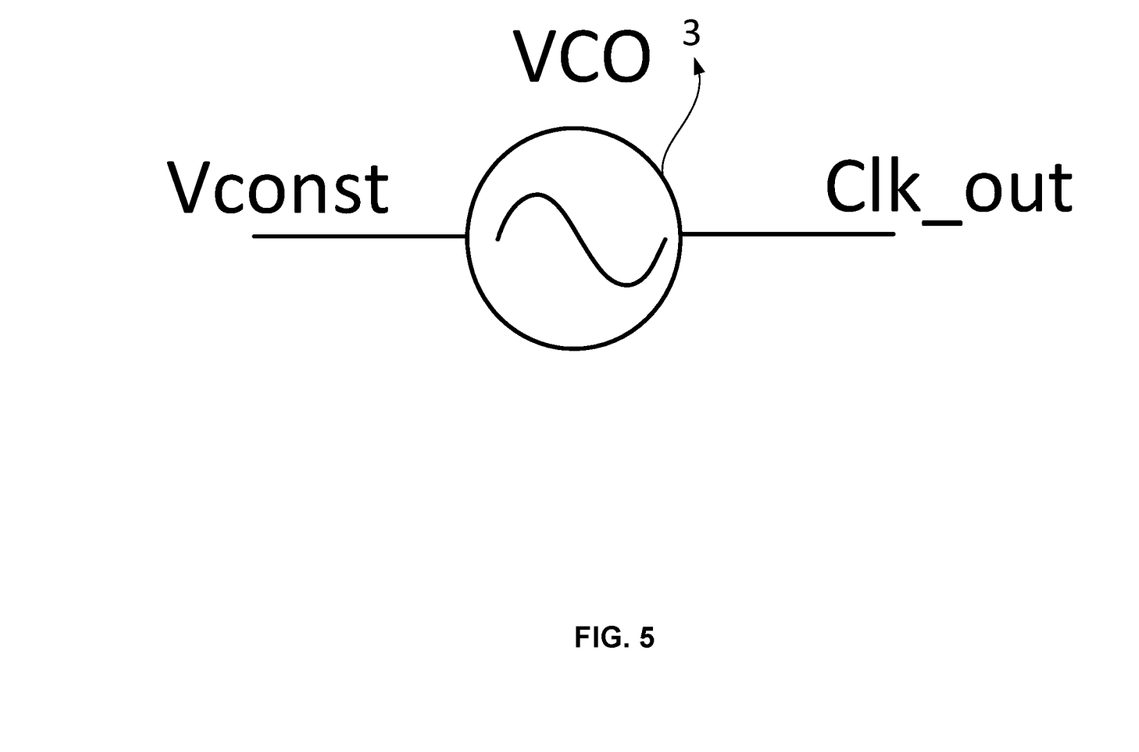
FIG. 5 illustrates an open loop clock generator in accordance with some exemplary embodiments.

In some embodiments, the disclosed clock generators can be configured to operate in a bypass or open loop mode in which the feedback loop is disconnected. An exemplary configuration of such an open loop clock generator is shown in FIG. 5. In this configuration, the reference voltage is set to a constant voltage value (Vconst) and/or the bias currents are reduced. Such a configuration may be useful for the Always On and/or Sleep Mode, where a very slow clock may be needed (e.g., for the processor to just watch for wake up signals). Thus, processing in such modes is minimum, and because the clock frequency is low, the actual frequency accuracy may not be a critical factor.

It is thus evident that the disclosed embodiments relate to methods, devices and systems for providing PVT tolerant clock generators that can be used in low power and low cost applications. Two applications of the disclosed clock generators include IoT and biomedical applications, but the clock generators can be used in many applications that benefit from a low cost, low power and frequency-accurate clock generator. Notably, the disclosed clock generators eliminate the need for a crystal oscillator, which is often an expensive, external component of a chip. Moreover, the disclosed clock generators are simple to implement and deploy, and can use a single frequency calibration step to initially tune the frequency to a reference frequency value; after such calibration, the clock generator is robust in the presence of PVT variations.

Another notable feature of the disclosed clock generators is that it only suffices to use a reference voltage (V) and current (I) to keep the output frequency constant. This can be achieved by having a constant V/I ratio. In some implementations, the reference voltage and currents are a bandgap voltage and a bandgap current, while in other implementations, specific circuits are provided for generating the reference voltage and current. By the way of example and not by limitation, FIG. 3 and FIG. 4 show two reference generator circuits.

Moreover, the disclosed clock generators can generate a scalable clock frequency. The clock frequency can be changed through the use of a frequency divider that is coupled to the output clock and also forms part of a feedback loop to maintain the constant-valued output clock frequency. Additionally, the use of a switched capacitor resistor circuit as part of the feedback loop allows the generation of a voltage value based on output frequency and allows the provision of a tuned voltage for the VCO, while providing a low cost solution that is tolerant to PVT variations. The charging and discharging speed of the switching capacitor is proportional to the loop clock frequency (and its resistance is inversely proportional) and provides a negative feedback loop to control the output clock frequency.

Figure 6:
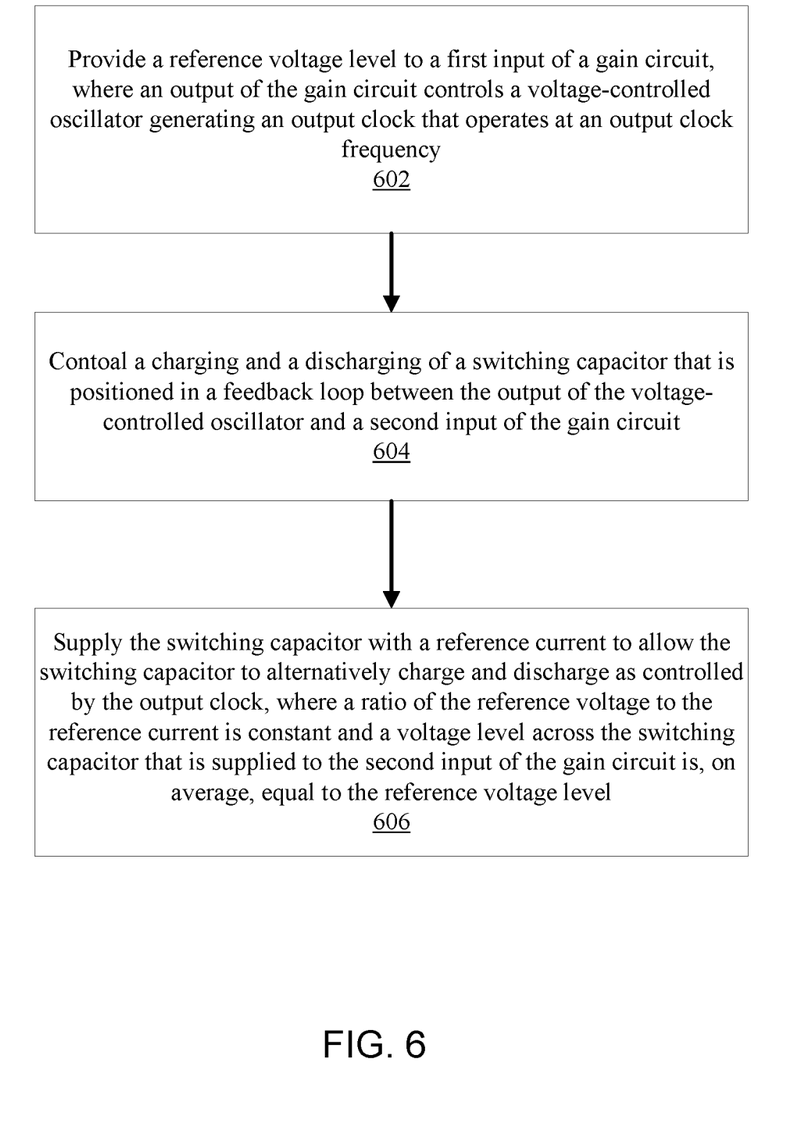
FIG. 6 illustrates a set of operations that can be carried out to generate a clock output in accordance with some exemplary embodiments.

FIG. 6 illustrates a set of operations that can be carried out to generate a clock output that is at a substantially constant frequency value without using a crystal oscillator in accordance with an exemplary embodiment. At 602, a reference voltage level is provided to a first input of a gain circuit. An output of the gain circuit controls a voltage-controlled oscillator generating an output clock that operates at an output clock frequency. At 604, a charging and a discharging of a switching capacitor is controlled. The switching capacitor is positioned in a feedback loop between the output of the voltage-controlled oscillator and a second input of the gain circuit. At 606, the switching capacitor is supplied with a reference current to allow the switching capacitor to alternatively charge and discharge as controlled by the output clock. In this operation, a ratio of the reference voltage to the reference current is constant and a voltage level across the switching capacitor that is supplied to the second input of the gain circuit is, on average, equal to the reference voltage level.

In one exemplary embodiment, the switching capacitor is controlled based on a loop clock frequency that is derived from, and is smaller than or equal to, the output clock frequency. In another example embodiment, the loop clock frequency is obtained from a programmable frequency divider that allows the loop clock frequency to be selectively produced as a fraction of the output clock frequency. In yet another example embodiment, the output clock frequency is an integer or non-integer multiple of the loop clock frequency. In still another exemplary embodiment, the operations further include filtering noise associated with the voltage level across the switching capacitor. In one example embodiment, the filtering is carried out by a filtering capacitor.

In another example embodiment, the operations further include tuning the value of the output frequency based on one or both of: a value of switching capacitor, or a ratio of the reference voltage to the reference current. In another example embodiment, the switching capacitor comprises a programmable capacitor, and tuning the value of the output frequency includes changing the value of the switching capacitor by changing a value of the programmable capacitor. In one example embodiment, tuning the value of the output frequency includes tuning the output frequency to a nominal value. In still another exemplary embodiment, tuning the value of the output frequency includes changing the ratio of the reference voltage to reference to tune the output frequency to a nominal value.

One aspect of the disclosed technology relates to a clock generator that includes a voltage-controlled oscillator having a clock output, and a gain circuit having a first input that is configured to receive a reference voltage, where the gain circuit has a second input that is configured to receive a changeable voltage value. The clock generator further includes a frequency-to-voltage convertor circuit coupled to the output of the voltage-controlled oscillator and to the second input of the gain circuit. The frequency-to-voltage convertor circuit is configured to receive a reference current and produce the changeable voltage value at the second input of the gain circuit, and a ratio of the reference voltage to the reference current is constant.

In one exemplary embodiment, the frequency-to-voltage convertor circuit comprises a first switch, a second switch and a switching capacitor, and the first switch and the second switch are coupled to the clock output. In this embodiment, the first switch is configured to be activated while the second switch is deactivated and vice versa, and the switching capacitor is configured to be charged by the reference current upon activation of the second switch and be discharged upon activation of the first switch. In another example embodiment, the clock generator further includes a frequency divider circuit that is connected between the clock output and the frequency-to-voltage convertor circuit, where the frequency divider circuit is configured to generate a loop clock that controls the frequency-to-voltage convertor circuit, and the loop clock has a lower frequency value than the output clock. In yet another example embodiment, the output clock is operable at a first frequency value that is an integer or non-integer multiple of a loop clock frequency value.

According to another example embodiment, the clock generator further includes a capacitor connected to the frequency-to-voltage convertor circuit and to a ground connection to eliminate or reduce switching noise associated with the frequency-to-voltage convertor circuit. In another exemplary embodiment, variations in the changeable voltage value depend on frequency of the output clock, and the frequency-to-voltage convertor circuit is configured to produce the changeable voltage value at the second input of the gain circuit having an average value that is equal to the reference voltage value. In one exemplary embodiment, the output clock is operable to maintain a frequency at a constant value over a range of temperatures between −40 degrees Celsius to +125 degrees Celsius.

In another example embodiment, the frequency-to-voltage convertor circuit includes a tunable component that can be adjusted to achieve a particular constant valued output clock frequency. For example, the tunable component can be a capacitor. In one example embodiment, the tunable component is a programmable capacitor that can be programmed to provide a particular capacitance value. In some exemplary embodiments, one or both of the following is true: the clock generator is configured to receive the reference voltage from a bandgap voltage source, or the clock generator is configured to receive the reference current from a bandgap current source.

In another exemplary embodiment, the clock generator further includes a reference generator circuit that is configured to receive the reference voltage and generate the reference current from the reference voltage. In one example embodiment, the reference generator comprises an amplifier, a first transistor and a resistor. In this embodiment, the amplifier is configured to receive the reference voltage, and the first transistor is coupled to an output of the amplifier and configured to allow a current equal to the reference current to flow through the resistor. In one exemplary embodiment, the reference generator can further include a second transistor that is configured to form a current mirror in combination with the first transistor, wherein the reference current is generated as an output of the current mirror.

According to another example embodiment, the reference generator comprises a first current mirror comprising a first transistor and a second transistor, and a resistor. In this embodiment, the first transistor is configured to receive an input current and to enable a mirror current to be generated by the second transistor to flow through the resistor, and the voltage across the resistor forms the reference voltage. In yet another example embodiment, the reference generator further includes a third transistor configured to form a second current mirror in combination with the first transistor, where the reference current is generated as an output of the second current mirror. In still another example embodiment, the clock generator is configured to operate in a bypass mode where the frequency-to-voltage convertor circuit and the gain circuit are disabled, thus allowing the voltage-controlled oscillator to be controlled directly by a constant-valued reference voltage.

Another aspect of the disclosed embodiments relates to a clock generator circuit that includes a gain stage, a voltage-controlled oscillator, a frequency divider, and a switched capacitor resistor. In this configuration, a first input of the gain stage is configured to receive a reference voltage, an output of the gain stage is coupled to the voltage-controlled oscillator, an output of the voltage-controlled oscillator is coupled to the frequency divider, an end of the frequency divider is coupled to the switched capacitor resistor, the switched capacitor resistor is configured to receive a reference current, the switched capacitor resistor is configured to provide a switching voltage to a second input of the gain stage, and the reference voltage and the reference current have a constant ratio with respect to each other.

The subject matter described herein may be embodied in systems, apparatus, methods, and/or articles depending on the desired configuration. For example, at least a portion of the systems, apparatus, methods, and/or articles described herein can be implemented using one or more of the following: one or more semiconductor materials or substrates such as silicon, printed circuit board techniques, discrete electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. In the context of this document, a "machine-readable medium" may be any non-transitory media that can contain, store, communicate, propagate or transport the instructions for use by or in connection with an instruction execution system, apparatus, or device, such as a computer or data processor circuitry. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed herein.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A clock generator, comprising:
   a voltage-controlled oscillator having a clock output;
   a gain circuit having a first input that is configured to receive a reference voltage, the gain circuit having a second input that is configured to receive a changeable voltage value; and
   a frequency-to-voltage convertor circuit coupled to the output of the voltage-controlled oscillator and to the second input of the gain circuit; wherein:
   the frequency-to-voltage convertor circuit is configured to receive a reference current and produce the changeable voltage value at the second input of the gain circuit, and
   a ratio of the reference voltage to the reference current is constant, wherein the clock generator is configured to operate in a bypass mode where the frequency-to-voltage convertor circuit and the gain circuit are disabled, thus allowing the voltage-controlled oscillator to be controlled directly by a constant-valued reference voltage.

2. The clock generator of claim 1, wherein:
   the frequency-to-voltage convertor circuit comprises a first switch, a second switch and a switching capacitor;
   the first switch and the second switch are coupled to the clock output;
   the first switch is configured to be activated while the second switch is deactivated and vice versa; and
   the switching capacitor is configured to be charged by the reference current upon activation of the second switch and be discharged upon activation of the first switch.

3. The clock generator of claim 1, further including a frequency divider circuit connected between the clock output and the frequency-to-voltage convertor circuit, the frequency divider circuit configured to generate a loop clock that controls the frequency-to-voltage convertor circuit, the loop clock having a lower frequency value than the output clock.

4. The clock generator of claim 3, wherein the output clock is operable at a first frequency value that is a multiple of a loop clock frequency value.

5. The clock generator of claim 1, further including a capacitor connected to the frequency-to-voltage convertor circuit and to a ground connection to eliminate or reduce switching noise associated with the frequency-to-voltage convertor circuit.

6. The clock generator of claim 1, wherein variations in the changeable voltage value depend on frequency of the output clock, and the frequency-to-voltage convertor circuit in configured to produce the changeable voltage value at the second input of the gain circuit having an average value that is equal to the reference voltage value.

7. The clock generator of claim 1, wherein the output clock is operable to maintain a frequency at a constant value over a range of temperatures between −40 degrees Celsius to +125 degrees Celsius.

8. The clock generator of claim 1, wherein the frequency-to-voltage convertor circuit includes a tunable component that can be adjusted to achieve a particular constant valued output clock frequency.

9. The clock generator of claim 8, wherein the tunable component is a capacitor.

10. The clock generator of claim 1, wherein one or both of the following is true:
    the clock generator is configured to receive the reference voltage from a bandgap voltage source, or
    the clock generator is configured to receive the reference current from a bandgap current source.

11. The clock generator of claim 1, further comprising a reference generator circuit that is configured to receive the reference voltage and generate the reference current from the reference voltage.

12. A clock generator comprising:
    a voltage-controlled oscillator having a clock output;
    a gain circuit having a first input that is configured to receive a reference voltage, the gain circuit having a second input that is configured to receive a changeable voltage value; and
    a frequency-to-voltage convertor circuit coupled to the output of the voltage-controlled oscillator and to the second input of the gain circuit wherein:
    the frequency-to-voltage convertor circuit is configured to receive a reference current and produce the changeable voltage value at the second input of the gain circuit, and a ratio of the reference voltage to the reference current is constant;

the clock generator further comprising a reference generator circuit that is configured to receive the reference voltage and generate the reference current from the reference voltage, wherein the reference generator comprises an amplifier, a first transistor and a resistor;

the amplifier is configured to receive the reference voltage; and the first transistor is coupled to an output of the amplifier and configured to allow a current equal to the reference current to flow through the resistor.

13. The clock generator of claim 12, further including a second transistor configured to form a current mirror in combination with the first transistor, wherein the reference current is generated as an output of the current mirror.

14. The clock generator of claim 12, further including a capacitor connected to the frequency-to-voltage convertor circuit and to a ground connection to eliminate or reduce switching noise associated with the frequency-to-voltage convertor circuit.

15. The clock generator of claim 12, wherein variations in the changeable voltage value depend on frequency of the output clock, and the frequency-to-voltage convertor circuit in configured to produce the changeable voltage value at the second input of the gain circuit having an average value that is equal to the reference voltage value.

16. The clock generator of claim 12, wherein the frequency-to-voltage convertor circuit includes a tunable component that can be adjusted to achieve a particular constant valued output clock frequency.

17. The clock generator of claim 16, wherein the tunable component is a capacitor.

18. The clock generator of claim 12, wherein the clock generator is configured to operate in a bypass mode where the frequency-to-voltage convertor circuit and the gain circuit are disabled, thus allowing the voltage-controlled oscillator to be controlled directly by a constant-valued reference voltage.

19. The clock generator of claim 12, further including a frequency divider circuit connected between the clock output and the frequency-to-voltage convertor circuit, the frequency divider circuit configured to generate a loop clock that controls the frequency-to-voltage convertor circuit, the loop clock having a lower frequency value than the output clock.

20. Clock generator comprising:
a voltage-controlled oscillator having a clock output;
a gain circuit having a first input that is configured to receive a reference voltage, the gain circuit having a second input that is configured to receive a changeable voltage value; and
a frequency-to-voltage convertor circuit coupled to the output of the voltage-controlled oscillator and to the second input of the gain circuit wherein:

the frequency-to-voltage convertor circuit is configured to receive a reference current and produce the changeable voltage value at the second input of the gain circuit, and a ratio of the reference voltage to the reference current is constant;

the clock generator further comprising a reference generator circuit that is configured to receive the reference voltage and generate the reference current from the reference voltage, wherein the reference generator comprises:

a first current mirror comprising a first transistor and a second transistor, and a resistor;

the first transistor is configured to receive an input current and to enable a mirror current to be generated by the second transistor to flow through the resistor; and the voltage across the resistor forms the reference voltage.

21. The clock generator of claim 20, further including a third transistor configured to form a second current mirror in combination with the first transistor, wherein the reference current is generated as an output of the second current mirror.

22. The clock generator of claim 20, wherein the clock generator is configured to operate in a bypass mode where the frequency-to-voltage convertor circuit and the gain circuit are disabled, thus allowing the voltage-controlled oscillator to be controlled directly by a constant-valued reference voltage.

23. The clock generator of claim 20, further including a capacitor connected to the frequency-to-voltage convertor circuit and to a ground connection to eliminate or reduce switching noise associated with the frequency-to-voltage convertor circuit.

24. The clock generator of claim 20, wherein variations in the changeable voltage value depend on frequency of the output clock, and the frequency-to-voltage convertor circuit in configured to produce the changeable voltage value at the second input of the gain circuit having an average value that is equal to the reference voltage value.

25. The clock generator of claim 20, wherein the frequency-to-voltage convertor circuit includes a tunable component that can be adjusted to achieve a particular constant valued output clock frequency.

26. The clock generator of claim 25, wherein the tunable component is a capacitor.

27. The clock generator of claim 20, further including a frequency divider circuit connected between the clock output and the frequency-to-voltage convertor circuit, the frequency divider circuit configured to generate a loop clock that controls the frequency-to-voltage convertor circuit, the loop clock having a lower frequency value than the output clock.

* * * * *